US009389999B2

(12) United States Patent
Kern et al.

(10) Patent No.: US 9,389,999 B2
(45) Date of Patent: Jul. 12, 2016

(54) SYSTEM AND METHOD FOR EMULATING AN EEPROM IN A NON-VOLATILE MEMORY DEVICE (75) Inventors: Thomas Kern, Munich (DE); Jens Rosenbusch, Munich (DE); Ulrich Backhausen, Taufkirchen (DE); Edvin Paparisto, Munich (DE); Thomas Nirschl, Putzbrunn (DE)

(73) Assignee: Infineon Technologies AG, Neubiberg (DE)

( * ) Notice: Subject to any disclaimer, the term of this patent is extended or adjusted under 35 U.S.C. 154(b) by 276 days.

(21) Appl. No.: 13/587,993

(22) Filed: Aug. 17, 2012

(65) Prior Publication Data

US 2014/0052896 A1 Feb. 20, 2014

(51) Int. Cl.
*G06F 12/00* (2006.01)
*G06F 12/02* (2006.01)
*G11C 16/10* (2006.01)

(52) U.S. Cl.
CPC .......... *G06F 12/0246* (2013.01); *G11C 16/105* (2013.01); *G06F 2212/1044* (2013.01); *G06F 2212/7202* (2013.01)

(58) Field of Classification Search
CPC .................... G06F 12/0246; G06F 2212/1044; G06F 2212/7202; G11C 16/105
USPC ......................................................... 711/103
See application file for complete search history.

(56) References Cited

U.S. PATENT DOCUMENTS

| 5,455,792 | A  | * | 10/1995 | Yi ....................... H01L 29/7885 257/316 |
| 8,510,026 | B2 | * | 8/2013 | Desanzo et al. ............... 701/120 |
| 2005/0068808 | A1 | * | 3/2005 | Quader .................. G11C 16/14 365/185.18 |
| 2010/0262761 | A1 | * | 10/2010 | Borchers et al. .............. 711/103 |

OTHER PUBLICATIONS

Melissa Hunter, et al.; "Using the Kinetis Family Enhanced EEPROM Functionality", Freescale Semiconductor: Application Note, Doc. No. AN4282, Mar. 2011, p. 19.

* cited by examiner

*Primary Examiner* — Matthew Bradley
(74) *Attorney, Agent, or Firm* — Eschweiler & Associates, LLC (57) ABSTRACT The invention relates to an electronic memory system, and more specifically, to a system for emulating an electrically erasable programmable read only memory in a non-volatile memory device, and a method of emulating an electrically erasable programmable read only memory in a non-volatile memory device. According to an embodiment, a system for emulating an electrically erasable programmable read only memory is provided, the system including a Flash memory, wherein the Flash memory is configurable into a first region and a second region, wherein the first region is adapted to store a first class of data and the second region is adapted to store a second, different class of data.

22 Claims, 8 Drawing Sheets

SYSTEM AND METHOD FOR EMULATING AN EEPROM IN A NON-VOLATILE MEMORY DEVICE

FIELD

The invention generally relates to an electronic memory system, and more specifically, to a system for emulating an electrically erasable programmable read only memory (EEPROM) in a non-volatile memory device, and a method of emulating an electrically erasable programmable read only memory (EEPROM) in a non-volatile memory device.

BACKGROUND

High-end microcontroller applications for automotive products need a big number of electrically erasable programmable read only memory (EEPROM) which is usually emulated by on-chip Flash. While both EEPROM and Flash memory allow data to remain stored even when the memory is not powered and therefore both belong to the class of non-volatile memory, EEPROM and Flash memory differ from each other in the way they allow data which is stored in the memory to be erased. Generally, EEPROM can be erased with a finer granularity than Flash memory.

Flash memory is structured as a collection of blocks of memory cells. In operation of the memory, a block has to be erased before new data can be written to this block. There are two types of Flash memory: NOR memories and NAND memories. In the NOR type, memory cells can generally be programmed and read one byte or one word at a time. In the NAND type, however, each block is divided into a certain number of pages, with each page containing a certain number of memory cells. Programming and reading of NAND Flash can only be done in pages, not in bytes or words. NOR type arrays offer fast random read access whereas NAND type arrays have relatively slow random access. The finer program granularity and the faster read access time are reasons why usually NOR type Flash or architectures with similar characteristics are chosen for the emulation of an EEPROM.

Typical erase or block sizes of Flash memories used for EEPROM emulation are: minimum one word line (around 256 Bytes to 1024 Bytes); often there are bigger sizes around 4 KiloBytes (KB) to 16 KB or even more (e.g. 64 KB). The block size depends on the architecture which is designed in a way to support the EEPROM emulation requirements of the end user.

Therefore, since Flash memory cannot be erased with fine EEPROM-like granularity (e.g. bit-wise or 1 Byte) it is necessary to emulate an EEPROM function by writing updates at free places of the Flash memory and keep the logical address information within the data written, since there is no 1:1 correlation of logical and physical address anymore.

If a data word is to be updated, the new version will be programmed at a free place in a sub-sector. The data words contain address and history so that always the most recent data word can be identified. If the sub-sector is full, only the most recent versions of the data words will be copied into the next sub-sector; then the previous sub-sector is erased to offer free place for the next EEPROM updates. This emulation scheme needs more physical Flash cells because the old versions of data are not immediately erased. Therefore, the size of a Flash memory employed for emulating an EEPROM has to be larger than the size of this EEPROM.

Usually, the Flash memory size (flash_size) required for emulating an EEPROM of a given size (EEPROM_size) is expressed as a multiple of the size of the EEPROM (flash_size=factor×EEPROM_size). Conventional emulating schemes typically result in factors between 4.5 and 6. Therefore, for emulating an EEPROM of 128 KB, a Flash memory of up to 768 KB is required. A bigger Flash memory, however, requires more physical space than a smaller Flash memory and results in higher costs of the system used for emulating the EEPROM. Therefore, at present, it is difficult to keep a system for emulating an EEPROM by Flash memory small and cheap.

For these or other reasons there is a need for improved systems and methods for emulating an EEPROM by Flash memory.

SUMMARY

In accordance with an aspect of the invention, there is provided a system for emulating an electrically erasable programmable read only memory, the system comprising a non-volatile memory, wherein the non-volatile memory is configurable into a first region and a second region, wherein the first region is adapted to store a first class of data and the second region is adapted to store a second class of data.

In accordance with a further aspect of the invention, there is provided a method of emulating an electrically erasable programmable read only memory in a memory device comprising a non-volatile memory. The method comprises configuring the non-volatile memory into a first region and a second region, storing data of a first class in the first region, and storing data of a second class in the second region.

Further features, aspects and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated, as they become better understood by reference to the following detailed description.

DETAILED DESCRIPTION

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

Figure 1A:
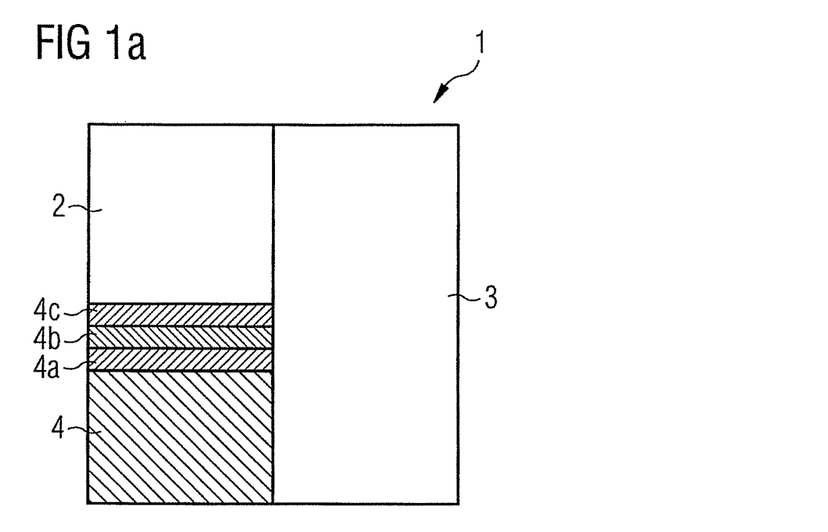
FIG. 1a depicts a schematic representation of a Flash memory as used in a conventional EEPROM emulation scheme after performing a limited number of data updates.

FIG. 1a depicts a schematic representation of a Flash memory 1 as used in a conventional EEPROM emulation scheme after performing a limited number of data updates. The Flash memory 1 is divided into a first sub-sector 2 and a second sub-sector 3. While this EEPROM emulation scheme uses two sub-sectors, other conventional EEPROM emulation schemes use more than two sub-sectors, e.g. three, four, or even more than four sub-sectors. Data 4 which is to be stored in the EEPROM is stored in the first sub-sector 2 of the Flash memory 1. If a portion of the data 4, e.g. a data word, is to be updated, the new version of this portion of the data 4, i.e. data update 4a, will be programmed at a free place in the first sub-sector 2. Subsequent updates, e.g. data updates 4b and 4c, will also be programmed at free places in the first sub-sector 2.

Figure 1B:
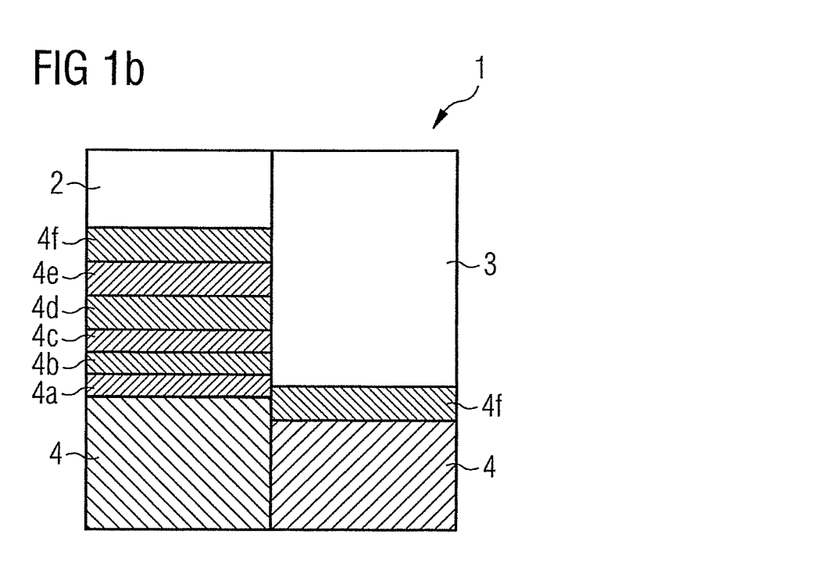
FIG. 1b depicts a schematic representation of a Flash memory as used in a conventional EEPROM emulation scheme after copying the most recent version of the data into a fresh Flash sub-sector.

As shown in FIG. 1b, this process will continue until a predefined data threshold is reached, i.e. until the first sub-sector 2 is filled with a certain amount of data. In the embodiment shown in FIG. 1b, six data updates 4a, 4b, 4c, 4d, 4e, and 4f have been written to the first sub-sector 2. After writing these six data updates to the first sub-sector 2, the predefined data threshold was reached. Therefore, in a next step of the EEPROM emulation scheme, the most recent version of the updated data, i.e. data update 4f, will, together with the portion of the data 4 that is still valid, be copied into the second sub-sector 3 of the Flash memory 1.

After the valid data has been copied into the second sub-sector 3, the first sub-sector 2 can be erased. Subsequent data updates will then be programmed at free places in the second sub-sector 3, again until a predefined data threshold is reached. Once this predefined data threshold is reached, the valid data stored in the second sub-sector 3 will be copied to the first sub-sector 2. In this way, always one of the first or second sub-sectors 2 and 3 will receive data updates, while the other sub-sector only contains data that is no longer needed; therefore, this sub-sector can be erased.

Figure 2A:
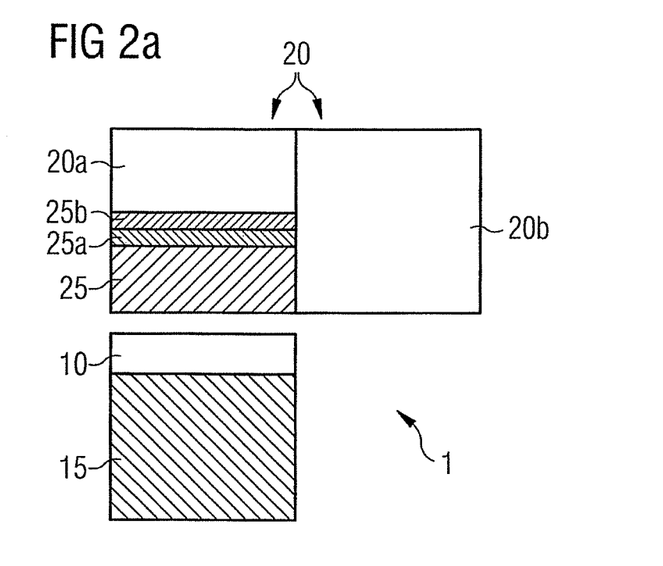
FIG. 2a depicts a schematic representation of a Flash memory of a system according to an embodiment of the invention which is configured into a first region adapted to store a first class of data and a second region adapted to store a second class of data, and wherein the data stored in the first region has not been updated, whereas the data stored in the second region has been updated a few times.

FIG. 2a shows a schematic representation of a Flash memory 1 according to an embodiment of the invention which is configured into a first region 10 adapted to store a first class of data 15 and a second region 20 adapted to store a second class of data 25. The data 15 of the first class has not been updated, whereas the data 25 of the second class has been updated two times, i.e. two data updates 25a and 25b have been written to the second region 20.

In one embodiment of the invention, the characteristics of data of the first class of data 15 differ from the characteristics of data of the second class of data 25 in at least one aspect. In particular, the frequency of data updates in the first class of data 15 may differ from the frequency of data updates in the second class of data 25. For instance, the first class of data 15 may be adapted to get updated less frequently than the second class of data 25. The first class of data 15 may therefore be referred to as quasi-static data, whereas the second class of data 25 may be referred to as frequently updated data. If, for example, the system for emulating an EEPROM according to the invention is integrated into an automotive product, data belonging to the first class of data 15 may be data referring to characteristics of the vehicle that do not change during operation of the vehicle, whereas data belonging to the second class of data 25 may be data referring to characteristics of the vehicle that change frequently during operation of the vehicle, such as the kilometer reading or frequently updated values of sensors provided in the vehicle.

As shown in FIG. 2a, the second region 20 of the Flash memory 1 is divided into a first sub-sector 20a and a second sub-sector 20b. These two sub-sectors 20a and 20b may be used to implement an EEPROM emulation scheme as described in the context of FIGS. 1a and 1b. Then updates of the data of the second class 25 will be written to free places of the first sub-sector 20a.

Figure 2B:
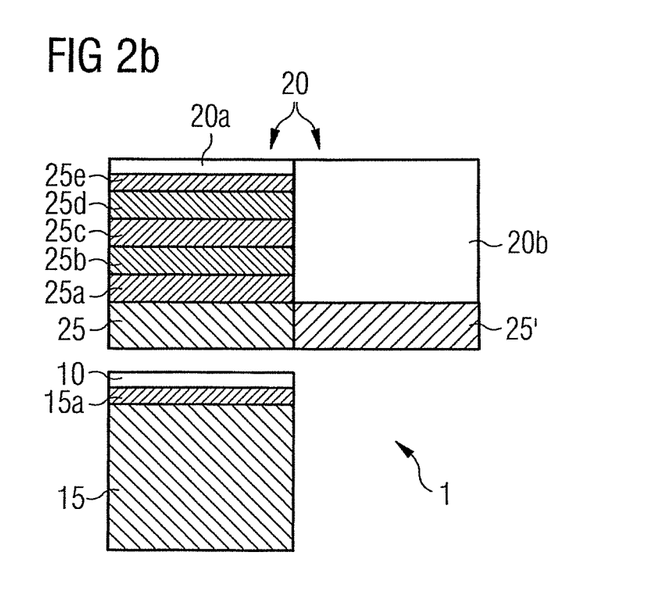
FIG. 2b depicts a schematic representation of a Flash memory of a system according to an embodiment of the invention which is configured into a first region adapted to store a first class of data and a second region adapted to store a second class of data, and wherein a part of the data stored in the first region has been updated once, whereas the data stored in the second region has, at least partly, been updated several times.

In the embodiment of the invention shown in FIG. 2b, five data updates, i.e. data updates 25a, 25b, 25c, 25d, and 25e have been written into the first sub-sector 20a of the second region 20 of the Flash memory 1. When a predefined data threshold of the first sub-sector 20a is reached, the valid data stored in the first sub-sector 20a, i.e. for instance data 25', will be copied into the second sub-sector 20b. The first sub-sector 20a can then be erased since the data stored in the first sub-sector 20a is no longer needed. Subsequent updates to the data of the second class 25 will then be written to free places of the second sub-sector 20b. The data of the first class 15 which is updated less frequently than the data of the second class 25 has been partly updated just once, i.e. only one data update 15a has been written to the first region 10 of the Flash memory 1.

Since the data of the first class 15 is only rarely updated, it is sufficient to provide some small amount of free memory space in the first region 10. In particular, in one embodiment of the invention, the size of the first region 10 may be chosen to be between 1.1 and 1.2 times the size of the data of the first class 15 that needs to be stored for a specific application. Since in this embodiment the free space of the first region 10 is significantly smaller than the size of the data of the first class 15, it might be advantageous to do updates of the data of the first class 15 in several steps (update one part of the data of the first class 15, e.g. part 15a, delete the old version of part 15a, use the new free space of old part 15a to update the next part of the data of the first class 15).

According to a further embodiment of the invention, the first region 10 is dimensioned to be two times the size of the data of the first class 15. Therefore, an update of the data of the first class 15 could be done very easily (write an update of the data of the first class 15 into the free space, delete the old version of the data of the first class 15). According to a further embodiment of the invention, the first region 10 is dimensioned to be large enough to receive all data updates to data of the first class 15 that are expected to be generated during the lifetime of the system according to the invention.

Dividing the data which is to be stored in the EEPROM into a first class of data 15 and into a second class of data 25 and configuring the Flash memory 1 into a first region 10 which is adapted to store the first class of data 15 and into a second region 20 which is adapted to store the second class of data 25 reduces the overall size of the Flash memory that has to be provided in order to emulate an EEPROM of a given size. This is illustrated in FIGS. 1a and 1b and FIGS. 2a and 2b which show that in the embodiment of the invention depicted in FIGS. 2a and 2b the size of the Flash memory 1 is smaller than the size of the Flash memory 1 in the conventional EEPROM emulation scheme depicted in FIGS. 1a and 1b.

Figure 3A:
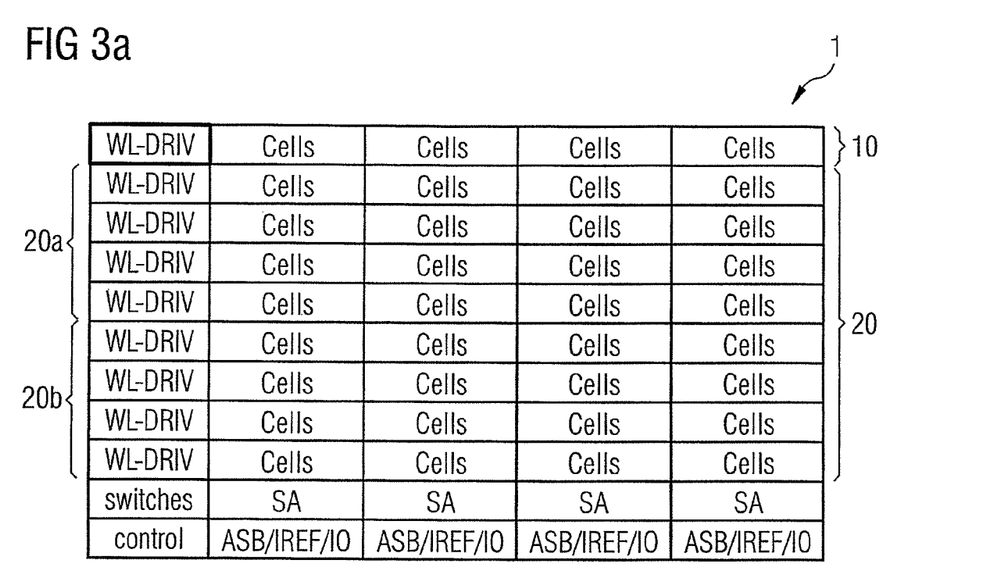
FIG. 3a depicts a schematic representation of a Flash memory of a system according to a further embodiment of the invention, wherein the first region comprises one block and the second region comprises eight blocks.

FIG. 3a shows a schematic representation of a Flash memory 1 of a system according to a further embodiment of the invention. The Flash memory 1 is divided into eight blocks. Each of these blocks corresponds to one line of the grid depicted in FIG. 3a. In one embodiment, each block has a size of 64 KB. The Flash memory 1 is configured into a first region 10 comprising one block and a second region 20 comprising eight blocks. In one embodiment, the second region 20 comprises a first sub-sector 20a of four blocks and a second sub-sector 20b of four blocks. The first and second sub-sectors 20a and 20b may be used to implement a conventional EEPROM emulation scheme in the second region 20. The Flash memory 1 furthermore comprises switches, sense amplifiers (SA), and controls.

Figure 3B:
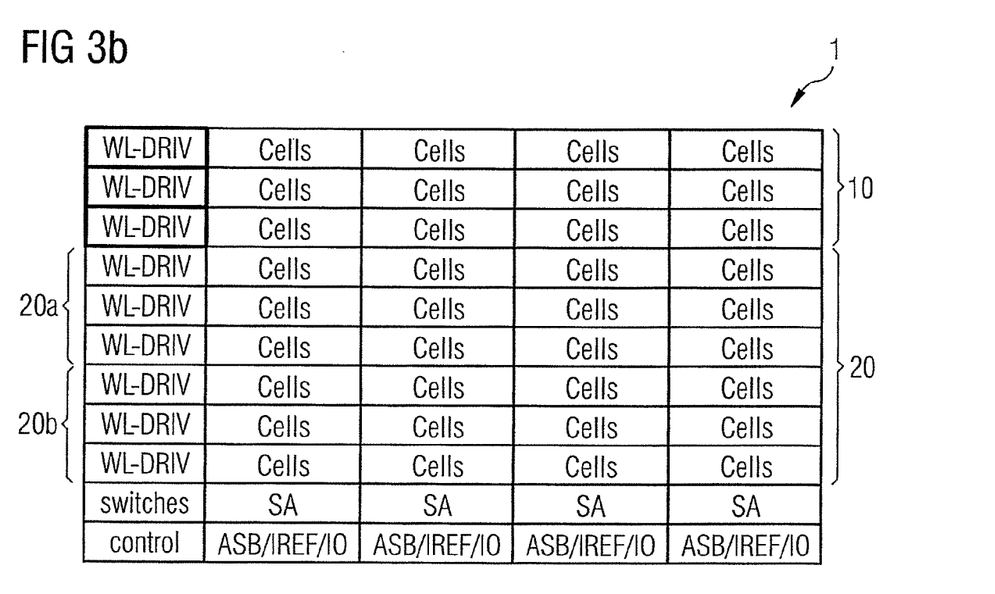
FIG. 3b depicts a schematic representation of a Flash memory of a system according to a further embodiment of the invention, wherein the first region comprises three blocks and the second region comprises six blocks.

The Flash memory 1 of the system according to the embodiment shown in FIG. 3b exhibits a different configuration from the Flash memory 1 shown in FIG. 3a. The Flash memory 1 of FIG. 3b is configured to contain a first region 10 of three blocks and a second region 20 of six blocks. In one embodiment, the second region 20 comprises a first sub-sector 20a of three blocks and a second sub-sector 20b of three blocks. Therefore, since the first region 10 is adapted to store a first class of data and the second region 20 is adapted to store a second class of data, the ratio of first class data to second class data storable in the Flash memory 1 differs from the embodiment according to FIG. 3a to the embodiment according to FIG. 3b. This ratio is higher in the embodiment according to FIG. 3b than in the embodiment according to FIG. 3a.

Figure 4:
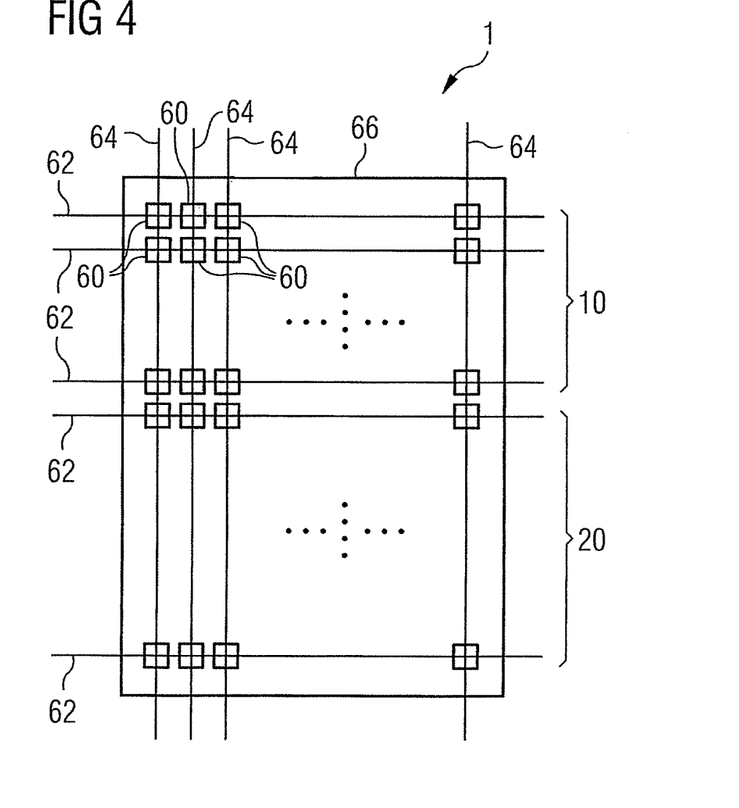
FIG. 4 depicts a simplified schematic representation of a Flash device according to one embodiment of the invention.

FIG. 4 exemplarily shows a simplified schematic representation of a Flash device according to one embodiment of the invention. The Flash device comprises a Flash memory 1 comprising a plurality of memory cells 60. The memory cells 60 are configured into a first region 10 and into a second region 20. The memory cells 60 of the first region 10 are adapted to store a first class of data and the memory cells 60 of the second region 20 are adapted to store a second class of data. The Flash memory 1 comprises word lines 62 and bit lines 64. Each memory cell 60 comprises a floating gate transistor comprising a control gate and a drain terminal. The word lines 62 are connected to control gates of the floating gate transistors and the bit lines 64 are connected to drain terminals of the floating gate transistors. The floating gate transistors of the memory cells 60 are arranged to share the same well 66, i.e. the floating gate transistors of the memory cells 60 are arranged on a uniformly doped region of semiconductor substrate. In a further embodiment of the invention, each memory cell 60 comprises a memory element other than a floating gate transistor. This memory element may as well comprise a control gate.

In one embodiment of the invention, the memory cells 60 of the first region 10 are configured to get protection against erase disturbs whenever at least some of the memory cells 60 of the second region 20 are being erased. Generally, a memory cell is erased by applying a first voltage to the control gate of the floating gate transistor of this memory cell and by applying a second voltage to the well. Example values for the first and second voltages are −11 V and 8 V, respectively. The first voltage is applied to the control gate via a word line 62. Applying first and second voltages to the control gate and the well, respectively, the second voltage being different from the first voltage, results in a voltage difference being applied between the control gate and the well of the respective floating gate transistor. Since the floating gate transistors of the memory cells 60 share the same well 66, the second voltage applied to the well 66 in order to erase a given memory cell will also be applied to the other memory cells.

Therefore, according to a further embodiment of the invention, the memory cells 60 of the first region 10 are protected at least partially against erase disturbs experienced during erase operations of memory cells 60 of the second region 20 by applying to the control gates of the floating gate transistors of the memory cells 60 of the first region 10 an inhibit voltage which is the same as or at least close to the voltage applied to the well 66 whenever at least some of the memory cells 60 of the second region 20 are being erased. Therefore, the inhibit voltage is applied via word lines to the respective control gates in order to minimize erase disturbs. The memory cells 60 can be fully protected against erase disturbs by applying to the control gates the same voltage that is applied to the well 66 (full-inhibit voltage). Alternatively, the memory cells 60 can be partially protected against erase disturbs by applying to the control gates a voltage that is close to but different from the voltage that is applied to the well 66 (partial-inhibit voltage). If, for example, a voltage of 8 V is applied to the well 66, the full-inhibit voltage would also have a value of 8 V, whereas a partial-inhibit voltage might have a value of 3.5 V.

Thus, while during erase operations there is applied a large voltage difference between the gates of the floating gate transistors of the memory cells 60 of the second region 20 which are to be erased and the well 66, there is no or at least a smaller voltage difference between the gates of the floating gate transistors of the memory cells 60 of the first region 10 and the well 66. This protects the memory cells 60 of the first region 10 fully or at least partially against erase disturbs.

In one embodiment of the invention, configuration of the memory cells 60 into a first region 10 and into a second region 20 is controlled by a switch. This switch allows selection of those word lines 62 to which the inhibit voltage will be applied during erase operations of memory cells 60 of the second region 20. Therefore, the Flash memory 1 can be configured freely into the first region 10 and the second region 20. Since the memory cells 60 of the first region 10 are protected against erase disturbs experienced during erase operations of memory cells 60 of the second region 20, the first region 10 is adapted to store data which is rarely updated, i.e. quasi-static data. Even when the data stored in the second region 20 is updated frequently, the corresponding erase operations will not disturb the memory cells 60 of the first region 10 due to the erase protection of the memory cells 60 of the first region 10. Therefore, the second region 20 is adapted to store data which is frequently updated.

Figure 5A:
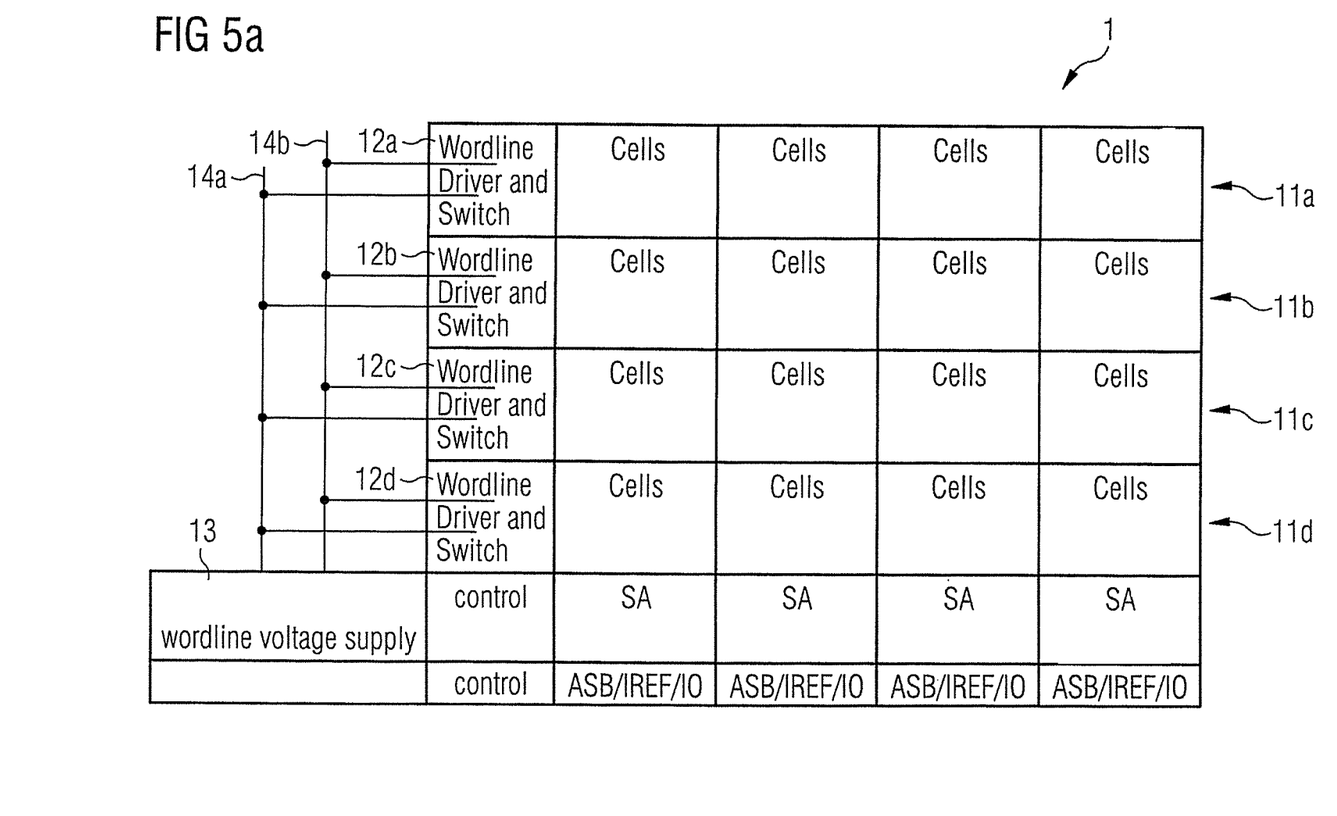
FIG. 5a depicts a schematic representation of a Flash memory according to an embodiment of the invention comprising several switches, each switch being associated with a distinct set of memory cells.

FIG. 5a shows an example schematic representation of a Flash device according to a further embodiment of the invention. The Flash memory 1 of this Flash device is divided into four blocks 11a, 11b, 11c, and 11d. Each of the four blocks 11a-11d comprises a respective word line driver and a switch 12a, 12b, 12c, or 12d. Furthermore, the Flash memory 1 comprises a word line voltage supply 13. The word line voltage supply 13 is configured to supply several distinct voltages, e.g. a partial-inhibit voltage, a full-inhibit voltage, or an erase voltage. The Flash memory 1 furthermore comprises voltage supply lines 14a and 14b for supplying the word line drivers and switches 12a-12d with the voltages supplied by the word line voltage supply 13. FIG. 5a shows an example first voltage supply line 14a and a second voltage supply line 14b which might be configured to supply the word line drivers and switches 12a-12d with a partial-inhibit voltage and a full-inhibit voltage, respectively. In a further embodiment the Flash memory 1 additionally comprises a third voltage supply line which is configured to supply the word line drivers and switches 12a-12d with an erase voltage.

Figure 5B:
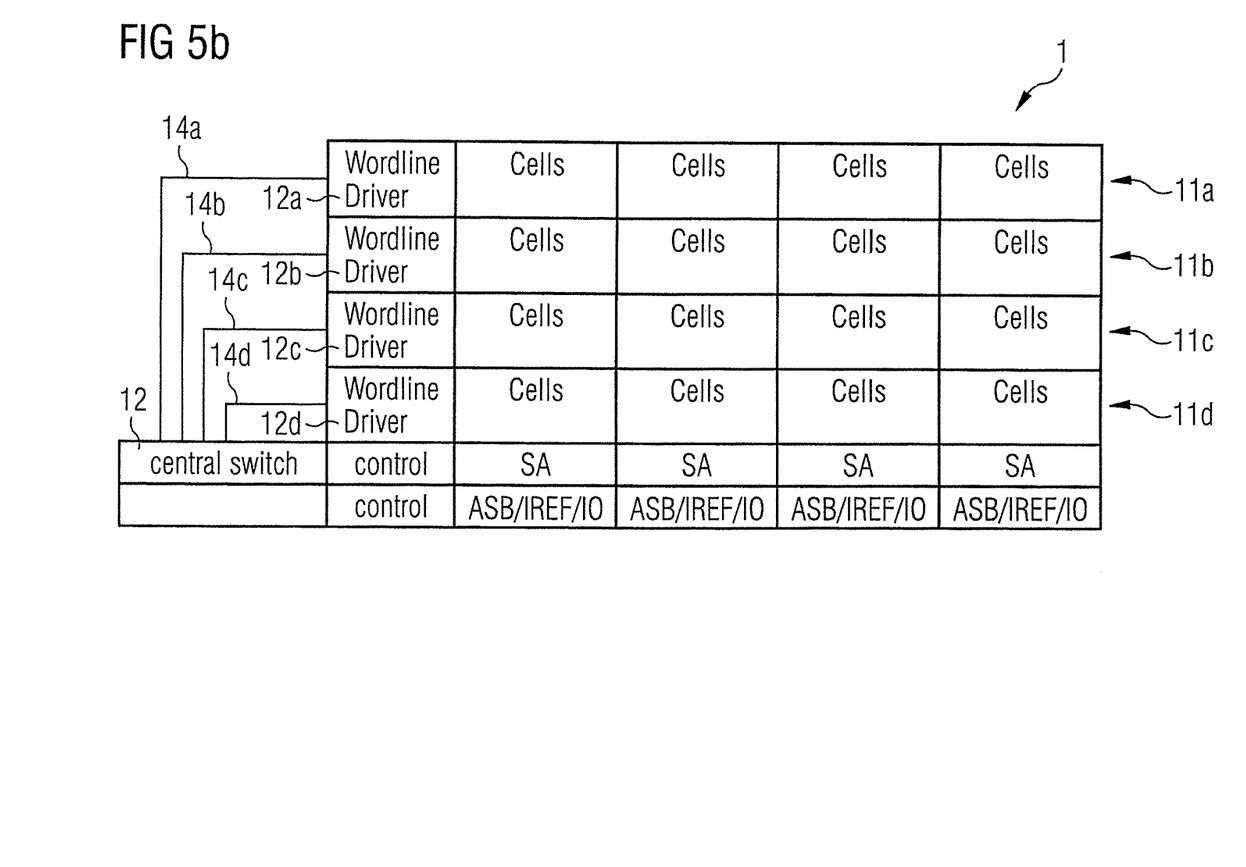
FIG. 5b depicts a schematic representation of a Flash memory according to a further embodiment of the invention comprising a central switch.

FIG. 5b shows a schematic representation of a Flash device according to a further embodiment of the invention. The Flash memory 1 of this Flash device is again divided into four blocks 11a, 11b, 11c, and 11d. Each of the four blocks 11a-11d comprises a respective word line driver 12a, 12b, 12c, or 12d. Furthermore, the Flash memory 1 comprises a central switch 12 and four voltage supply lines 14a, 14b, 14c, and 14d. Each of the four voltage supply lines 14a-14d couples one of the word line drivers 12a-12d to the central switch 12. In this way, voltage supply to the word line drivers 12a-12d can be controlled by the central switch 12. In one embodiment the central switch 12 is adapted to selectively supply the word line drivers 12a-12d with a full-inhibit voltage, a partial-inhibit voltage, or an erase voltage which are supplied by a word line voltage supply (not shown).

The switches 12a-12d of the embodiment according to FIG. 5a and the central switch 12 of the embodiment according to FIG. 5b allow configuration of the Flash memory 1 into a first region and a second region by specifying which voltages are supplied to the word lines of the blocks 11a-11d during erase operations. The switches 12a-12d and 12 may therefore comprise a memory element (e.g. a latch) to store the configuration information during runtime of the Flash device. Control of the switches 12a-12d and 12 may be done either automatically by hardware or by a state machine or by firmware. In one embodiment, this control of the switches 12a-12d or 12 is based on selection settings which are stored in a non-volatile way in a dedicated user block range of the Flash memory 1 reserved for this kind of settings.

The selection settings can be changed by a user of the Flash device according to the invention. Therefore, by choosing appropriate selection settings, the user can freely configure the Flash device into a first region and a second region. Consequently, the user has full control over the configuration of the Flash. Furthermore, the Flash memory is directly accessible to the user allowing the user to develop and employ his own algorithms for emulating an EEPROM using a system or Flash device according to the invention. The user could, for instance, implement a conventional EEPROM emulation scheme for the frequently-updated data in the second region 20 of the Flash memory 1. Since the first region 10 contains quasi-static data in one embodiment, there might be no need to implement the same emulation scheme for the second region 10. Therefore, it might be sufficient to provide for a relatively small amount of free space in the first region 10.

Figure 6:
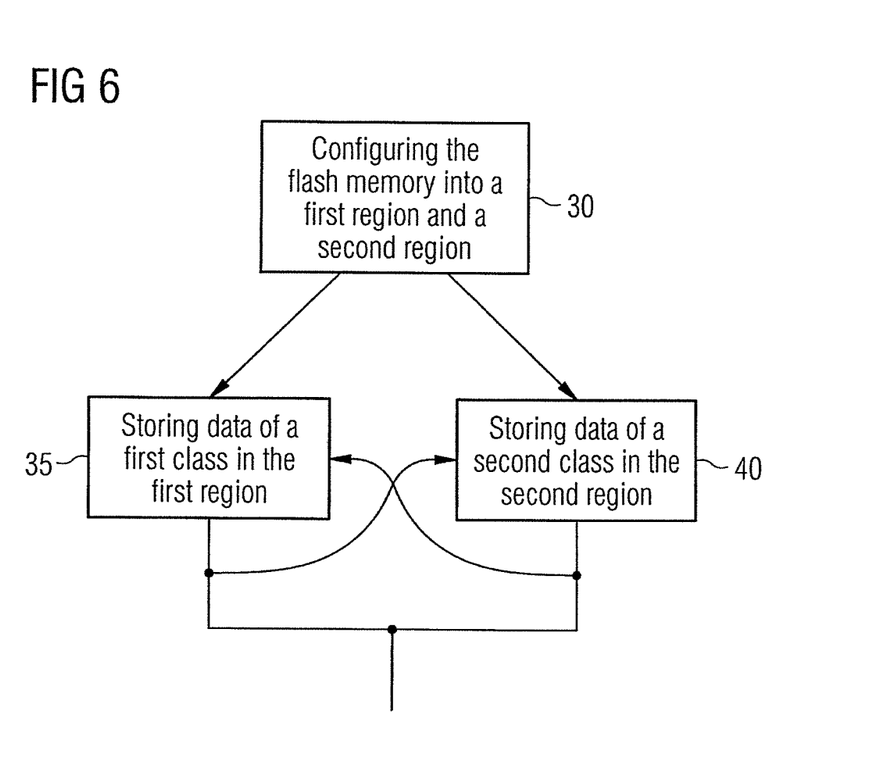
FIG. 6 depicts a flow chart diagram of a method of emulating an EEPROM in a Flash device according to an embodiment of the invention.

FIG. 6 shows an example method according to an embodiment of the invention. The method of emulating an electrically erasable programmable read only memory in a Flash device comprising a Flash memory comprises configuring the Flash memory into a first region and a second region at 30. storing data of a first class in the first region at 35, and storing data of a second class in the second region at 40. Acts 35 and 40 may be performed in an arbitrary order and may be repeated.

Figure 7:
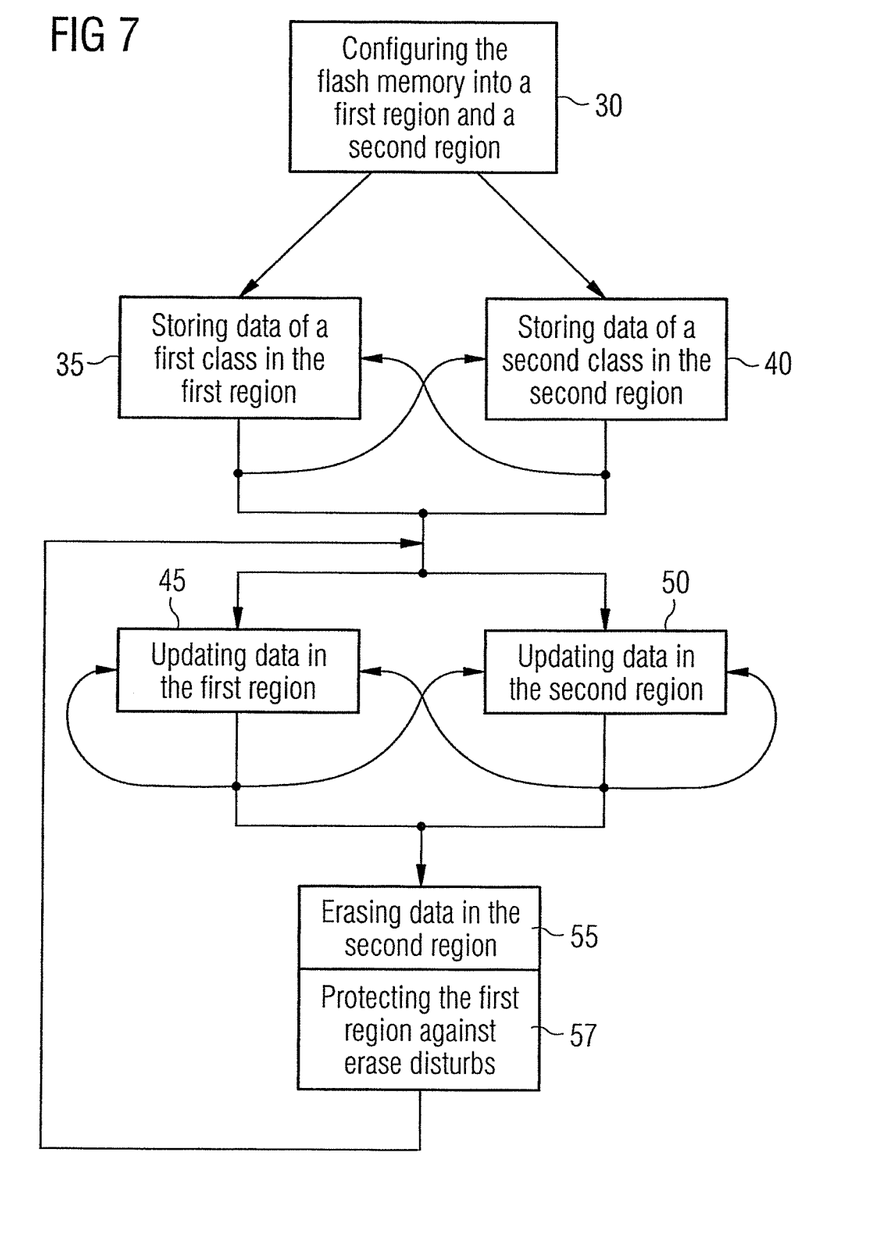
FIG. 7 depicts a flow chart diagram of a method of emulating an EEPROM in a Flash device according to a further embodiment of the invention.

In an example method according to a further embodiment of the invention depicted in FIG. 7, the method furthermore comprises updating data in the first region at 45, updating data in the second region at 50, erasing data in the second region at 55, and protecting the first region against erase disturbs at 57. Acts 45 and 50 may be performed in an arbitrary order and may be repeated. In one embodiment, acts 55 and 57 are performed simultaneously. In a further embodiment, acts 45 and/or 50 are repeated after the acts 55 and 57 have been performed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system configured to emulate an electrically erasable programmable read only memory, the system comprising a non-volatile memory, wherein
the non-volatile memory is configurable into a first region and a second region, wherein
the first region is configured to store a first class of data and the second region is configured to store a second, different class of data, wherein the first region and the second region of the non-volatile memory are arranged on one single semiconductor chip and share a same bit line and a common well of the one single semiconductor chip, the system further configured to provide a first voltage to a word line of the second region, and a second voltage different from the first voltage both to the common well of the first and the second region and to a word line of the first region to erase a cell of the second region and inhibit erasure of a cell of the first region.

2. The system of claim 1, wherein the first region is configured to get protection against erase disturbs whenever the second region is at least partially being erased.

3. The system of claim 1, wherein the first class of data is configured to get updated less frequently than the second class of data.

4. The system of claim 3, wherein the first class of data comprises quasi-static data.

5. The system of claim 1, wherein the first region is configured to allow at least partial updates of the data of the first class.

6. A device configured to emulate an electrically erasable programmable read only memory, the device comprising:
a Flash memory comprising a plurality of memory cells; and
means for configuring the memory cells into a first region and a second region, wherein the memory cells of the first region are configured to store a first class of data and the memory cells of the second region are configured to store a second, different class of data, and wherein the first region and the second region of the Flash memory are arranged on one single semiconductor chip and share a same bit line and a common well of the one single semiconductor chip, the device further configured to provide a first voltage to a word line of the second region, and a second voltage different from the first voltage both to the common well of the first and the second region and to a word line of the first region to erase a cell of the second region and inhibit erasure of a cell of the first region.

7. The device of claim 6, wherein the erasure of the cell of the first region is inhibited whenever at least some of the memory cells of the second region are being erased.

8. The device of claim 7, wherein erasure of the cell of the first region is inhibited based at least in part on providing an inhibit voltage to the memory cells of the first region whenever at least some of the memory cells of the second region are being erased.

9. The device of claim 8, wherein each memory cell comprises a floating gate transistor and wherein the inhibit voltage is applied to control gates of the floating gate transistors of the memory cells of the first region.

10. The device of claim 6, wherein the means for configuring the memory cells into a first region and a second region comprises a switch.

11. The device of claim 10, wherein the switch is configured to a control voltage supply to some or all of the memory cells.

12. The device of claim 10, wherein the switch is configured to be controlled by hardware or by a state machine or by firmware.

13. The device of claim 6, further comprising a dedicated memory range configured to store non-volatile storage of selection settings defining the first region and the second region.

14. The device of claim 13, wherein the selection settings are configured to be changeable by a user of the Flash device.

15. A method of emulating an electrically erasable programmable read only memory in a memory device comprising a non-volatile memory, the method comprising:
 configuring the non-volatile memory into a first region and a second region such that the first region and the second region are arranged on one single semiconductor chip and share a same bit line and a common well of the one single semiconductor chip,
 storing data of a first class in the first region,
 storing data of a second, different class in the second, different region,
 providing a first voltage to a word line of the second region, and
 providing a second voltage different from the first voltage both to the common well of the first and the second region and to a word line of the first region to erase a cell of the second region and inhibit erasure of a cell of the first region.

16. The method of claim 15, comprising:
 updating data in one of the first region or second region.

17. The method of claim 16, wherein the updating data in one of the first region or second region comprises storing updated data at a free place in said one of the first region or second region.

18. The method of claim 15, comprising:
 updating data in the first region; and
 updating data in the second region,
 wherein updating data in the second region is performed more frequently than updating data in the first region.

19. A method of emulating an electrically erasable programmable read only memory in a system comprising a Flash memory comprising a plurality of memory cells, the method comprising:
 configuring the memory cells into a first region and a second region such that the first region and the second region are arranged on one single semiconductor chip and share a same bit line and a common well of the one single semiconductor chip;
 storing data of a first class in at least some of the memory cells of the first region;
 storing data of a second, different class in at least some of the memory cells of the second region;
 providing a first voltage to a word line of the second region; and
 providing a second voltage different from the first voltage both to the common well of the first and the second region and to a word line of the first region to erase a cell of the second region and inhibit erasure of a cell of the first region.

20. The method of claim 19, wherein said configuring the memory cells into a first region and a second region comprises:
 reading selection settings from a dedicated memory range of the Flash memory configured to store non-volatile storage of the selection settings.

21. The method of claim 19, wherein erasure of the cell of the first region is inhibited whenever at least some of the memory cells of the second region are being erased.

22. The method of claim 21, wherein erasure of the cell of the first region is inhibited based at least in part on applying an inhibit voltage to the memory cells of the first region.

* * * * *